(12) United States Patent
Wang et al.

(10) Patent No.: US 7,650,211 B2
(45) Date of Patent: Jan. 19, 2010

(54) METHOD AND APPARATUS TO MONITOR AMBIENT SENSING DEVICES

(75) Inventors: Yue-Yun Wang, Troy, MI (US); Man-Feng Chang, Troy, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 59 days.

(21) Appl. No.: 11/669,961

(22) Filed: Feb. 1, 2007

(65) Prior Publication Data

US 2008/0189009 A1 Aug. 7, 2008

(51) Int. Cl.
*G01W 1/02* (2006.01)
*G01K 15/00* (2006.01)

(52) U.S. Cl. .................. 701/34; 701/29; 340/3.43; 340/539.26; 340/601; 702/185

(58) Field of Classification Search ............... 701/29, 701/34; 340/3.43, 539.26, 601; 702/188, 702/185

See application file for complete search history.

(56) References Cited

U.S. PATENT DOCUMENTS

| | | | | |
|---|---|---|---|---|
| 6,390,055 | B1 * | 5/2002 | Sivashankar et al. | 123/295 |
| 6,487,500 | B2 * | 11/2002 | Lemelson et al. | 701/301 |
| 6,877,357 | B2 * | 4/2005 | Herrmann et al. | 73/1.71 |
| 2002/0121132 | A1 * | 9/2002 | Breed et al. | 73/146 |
| 2005/0003844 | A1 * | 1/2005 | Nishiga et al. | 455/517 |

FOREIGN PATENT DOCUMENTS

| | | |
|---|---|---|
| JP | 2006-117232 A | 5/2006 |
| KR | 10-0820537 B1 | 4/2008 |

OTHER PUBLICATIONS

Y. Gunter and H. P. Grobmann, "Usage of Wireless LAN for Inter-Vehicle Communication," In Proc. 8th International IEEE Conference on Intelligent Transportation Systems, 2005, pp. 296-301.*

* cited by examiner

*Primary Examiner*—Thomas G Black
*Assistant Examiner*—Peter D Nolan

(57) ABSTRACT

A method is provided to monitor operation of a sensing system for a motor vehicle equipped with inter-vehicle communications capability. The method comprises comparing analogous signals communicated from a plurality of vehicles in close proximity thereto.

7 Claims, 4 Drawing Sheets

METHOD AND APPARATUS TO MONITOR AMBIENT SENSING DEVICES

TECHNICAL FIELD

This invention pertains generally to powertrain control systems and systems for detecting faults therein.

BACKGROUND OF THE INVENTION

Powertrain control architectures include systems for monitoring operation of various components and subsystems to ensure proper control and operation of the system based thereon, and to identify component and system faults. This includes devices and control algorithms which monitor ambient conditions. Vehicle manufacturers typically use an engine key-on test to detect a fault in an ambient pressure sensor by comparing its reading against another monitored pressure in the vehicle, e.g., turbocharger boost pressure and oil pressure. A similar method is used to detect faults in ambient air temperature sensors, typically after a soak period, wherein output of the ambient air temperature sensor is compared to an engine coolant temperature sensor or other sensor.

On-board fault detection and diagnosis of ambient pressure and air temperature sensors for automotive application can be challenging, since these sensor readings are affected by ambient conditions but typically not affected by other on-vehicle conditions. In other industries where accurate sensor readings affect ongoing system performance, e.g., the aerospace industry, multiple redundant sensors of the same critical type are deployed. Such systems utilize a voting technique whereby readings among the sensors are compared and used to detect a sensor fault, permitting the remaining sensor signals to be used to provide fault-tolerant control and monitoring. In the automotive industry, however, use of redundant sensors is typically cost-prohibitive.

Emissions-related diagnostics regulations typically require evaluation and detection of a fault in any sensor which affects emissions. A sensor fault can comprise an out-of-range fault, which is defined as an open circuit, i.e., zero volts output, or a short circuit, i.e., an output fixed at the power-supply voltage. A sensor fault can comprise an in-range fault, which is typically defined as a fault occurring in a sensing system wherein signal output of the sensing system is not a 'true' reading of the sensed parameter and not an out-of-range signal. An in-range sensor fault can be caused, for example, by sensor contamination or corrosion in a sensor wiring harness which skews the output signal.

Currently, automotive OEMs detect only open/short circuit faults in ambient air temperature and pressure sensors. There has been no effective in-range fault detection for systems which monitor ambient conditions beyond those occurring at vehicle start-up. However, the ambient pressure and temperature sensor readings can be used in engine control, e.g., to correct boost and adjust EGR flow. At high altitude, due to the ambient pressure drop, an ambient pressure or temperature sensor in-range failure can cause a turbocharger to over-speed, which can result in excessive heat and damage thereto. Therefore, prompt detection of in-range sensor faults can protect engine hardware and facilitate meeting future emissions regulations.

There is a need for an improved method to monitor and evaluate in-range performance of ambient sensors to address the issues described. Such a method is described hereinafter.

SUMMARY OF THE INVENTION

In accordance with an embodiment of the invention, a method is provided to monitor operation of a sensing system for a motor vehicle equipped with inter-vehicle communications capability. The method comprises comparing analogous signals communicated from a plurality of vehicles in close proximity thereto.

These and other aspects of the invention will become apparent to those skilled in the art upon reading and understanding the following detailed description of the embodiments.

BRIEF DESCRIPTION OF THE DRAWINGS

The invention may take physical form in certain parts and arrangement of parts, an embodiment of which is described in detail and illustrated in the accompanying drawings which form a part hereof, and wherein.

DETAILED DESCRIPTION OF AN EMBODIMENT OF THE INVENTION

Figure 1:
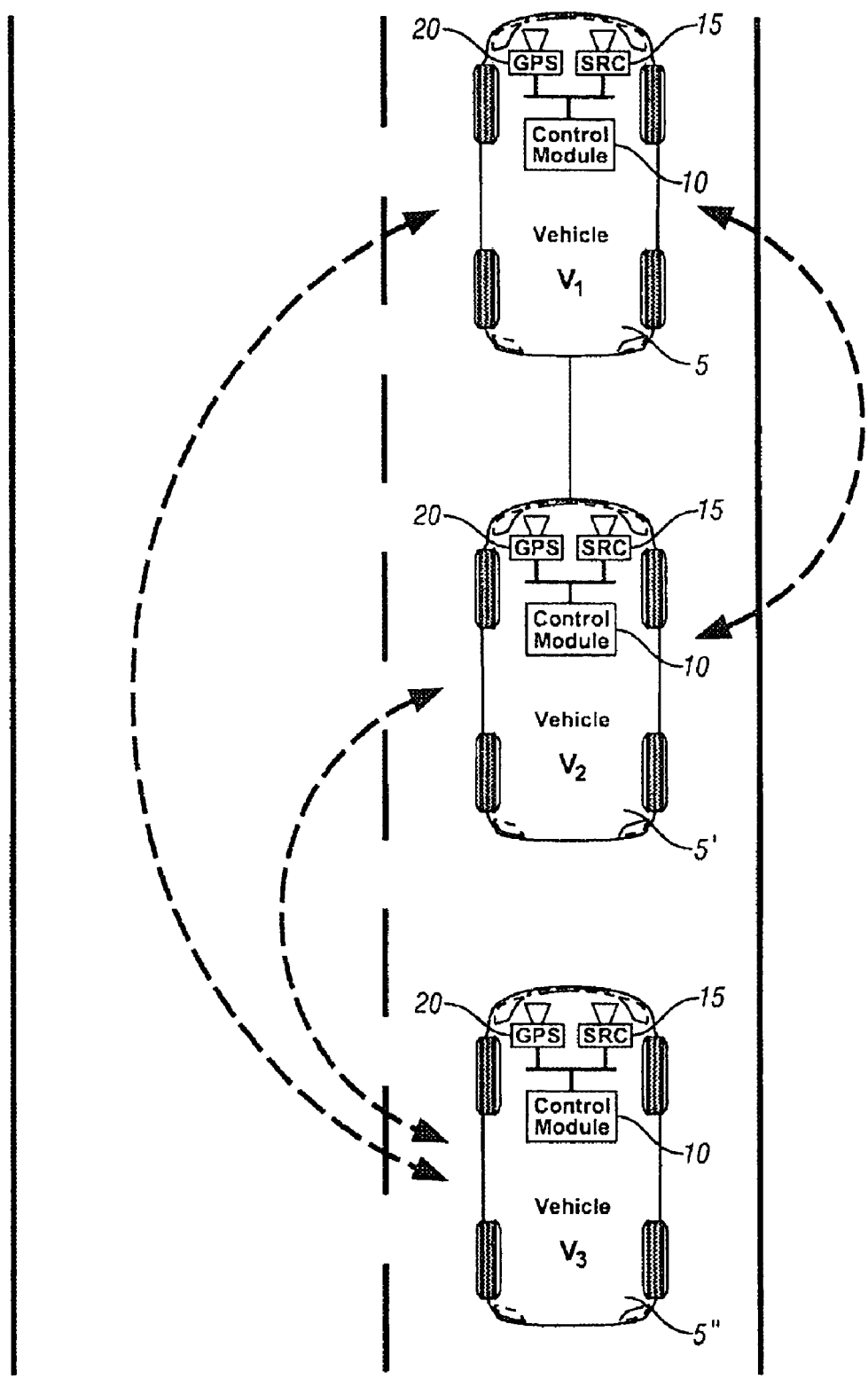
FIG. 1 comprises a schematic diagram, in accordance with the present invention; and, FIGS. 2-4 comprise logic flowcharts, in accordance with the present invention.

Referring now to the drawings, wherein the showings are for the purpose of illustrating the invention only and not for the purpose of limiting the same, FIG. 1 depicts a plurality of motorized land vehicles $V_1 5, V_2 5', V_3 5''$, in close proximity to each that have been mechanized in accordance with an embodiment of the invention, e.g., passenger cars. Each of the vehicles 5 is equipped with an extra-vehicle communications system. The extra-vehicle communications system comprises some form of wireless vehicle-to-vehicle communications system or other local communication system.

There is an overall vehicle control system, preferably comprising a distributed integrated control system having one or more control modules 10 adapted to control various vehicle operating systems via one or more local area networks on-board the vehicle, including, e.g., the engine, HVAC, and other systems which utilize on-board sensors to monitor ambient conditions. The vehicle control system includes a wireless communications system to communicate with a remote ground-based system and/or other vehicles to obtain additional information related to traffic management and other tasks. The wireless communication system comprises a short-to-medium range system ('SRC') 15 operative to communicate with other systems using known communications protocols such as direct short range communications ('DSRC') or IEEE 802.11. The vehicle control system can optionally include some form of long range communication, and a GPS system 20. Such systems provide standardized communications protocols for use in communicating between vehicles, and for use in broadcast communications. A typical on-vehicle wireless communication system includes a transceiver capable of extra-vehicle communications, a control module, and, optionally, a vehicle operator interface.

Each control module 10 preferably comprises a general-purpose digital computer generally including a microprocessor or central processing unit, storage mediums comprising read only memory (ROM), random access memory (RAM), electrically programmable read only memory (EPROM), high speed clock, analog to digital (A/D) and digital to analog conversion (D/A) circuitry, and input/output circuitry and devices (I/O) and appropriate signal conditioning and buffer circuitry. Each control module has a set of control algorithms, comprising machine-executable code and calibrations resident in the ROM and executable to provide the respective functions of each computer. Information transfer between the various control modules is preferably accomplished using a local area network (LAN).

The control module is signally connected to one or more sensing systems to obtain information therefrom to monitor and control operation of aspects of the vehicle. The sensing systems are preferably ambient sensors, comprising by way of example, sensing systems for temperature, pressure, humidity, precipitation, ice, and solar load, among others. By way of illustration, a typical sensing system comprises a sensing device and a signal connection to the control module, e.g., through the A/D circuitry. The sensing device can comprise a physical device which converts a physical state, e.g., temperature, to an electrically readable signal, e.g., a resistance in the case of a thermistor. The signal connection to the control module processes and communicates the electrically readable signal output from the sensing device, converting it to the signal reading input to the control module. The signal connection can comprise a wiring harness consisting of electrical cable leads and connectors between the sensing device and the control module. The signal connection can further comprise signal processing devices, e.g., capacitors and resistive devices and connections to electrical power supplies and electrical grounds to effectively generate and translate a signal output from the sensing device to the control module. The control module monitors the signal output and generates a signal reading therefrom, useable by algorithms to control and monitor aspects of engine and vehicle operation.

Referring now to the drawings, wherein the showings are for the purpose of illustrating the invention only and not for the purpose of limiting the same, FIG. 1 depicts schematically operation of a system which uses a network of vehicles to monitor operation on a specific vehicle to detect faults in sensing systems, e.g., those using inputs from ambient sensors. The method comprises comparing analogous signals communicated from a plurality of vehicles in close proximity thereto.

FIG. 1 illustrates, by way of example, vehicles $V_1$, $V_2$, $V_3$, which are within communications range, wherein vehicle $V_1$ comprises a host vehicle which is monitoring operation of its sensing systems. Each of the vehicles is equipped with a communications transceiver and with sensing systems operative to monitor and determine ambient conditions, including, e.g., temperature, pressure, and humidity. A maximum communication range is defined, within which variations in the ambient air pressure and temperature are presumed small or negligible.

At regular time intervals, one of the control modules, e.g., an engine control module, for each vehicle determines signal readings for an average ambient air pressure ($P_a$) and temperature ($T_a$) based upon inputs from on-board sensing systems and devices as described above. This is depicted for vehicle, Vi, in Eq. 1, below:

$$P_a(Vi) = \frac{1}{N}\sum_{i=1}^{N} P_{amb}(t), \quad [1]$$

$$T_a(Vi) = \frac{1}{N}\sum_{i=1}^{N} T_{amb}(t).$$

Figure 2:
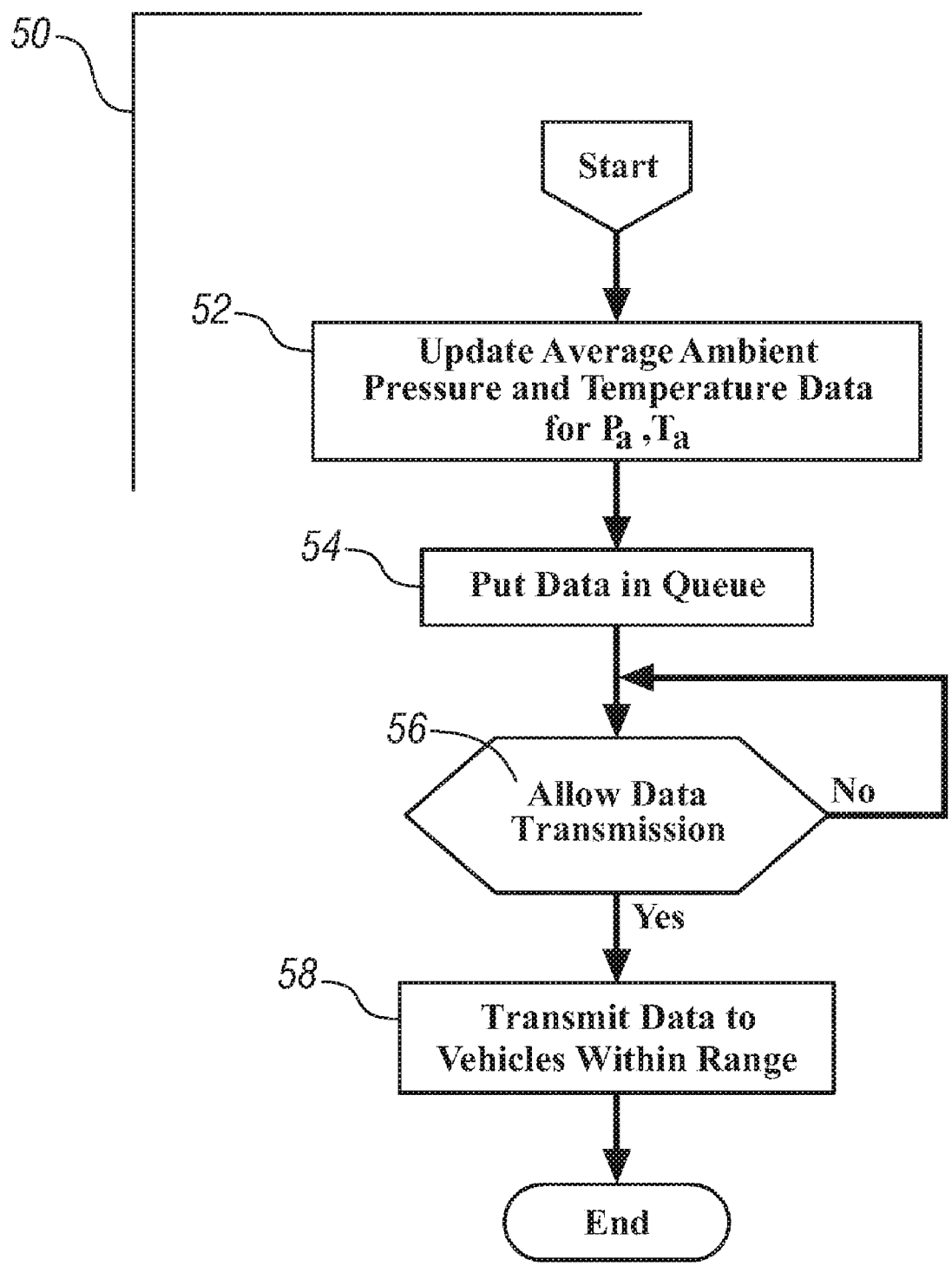

The values for average ambient air pressure ($P_a$) and temperature ($T_a$) are updated and saved in a memory device of the control module. Wireless vehicle communications networks typically give high priority to communicating safety-related signals, and therefore the average value ambient data are stored in a queue. When the communications system detects an idle condition (e.g., engine idle, or communications idle condition) and there is no safety-related communication pending, it transmits the signal readings comprising the average values for ambient air pressure and temperature to other vehicles within the communication range. Referring now to FIG. 2, a flowchart 50 illustrative of this operation is depicted, wherein average ambient data is updated for air pressure ($P_a$) and temperature ($T_a$) (Step 52), and placed in a communications queue (Step 54). When data transmission is allowed (Step 56), the air pressure ($P_a$) and temperature ($T_a$) data are transmitted to all vehicles within range of the host vehicle, $V_1$ (Step 58). Similarly, the host vehicle receives signal readings from the vehicles within range and having communications capability, which facilitates operation of the system described hereinafter.

Figure 3:
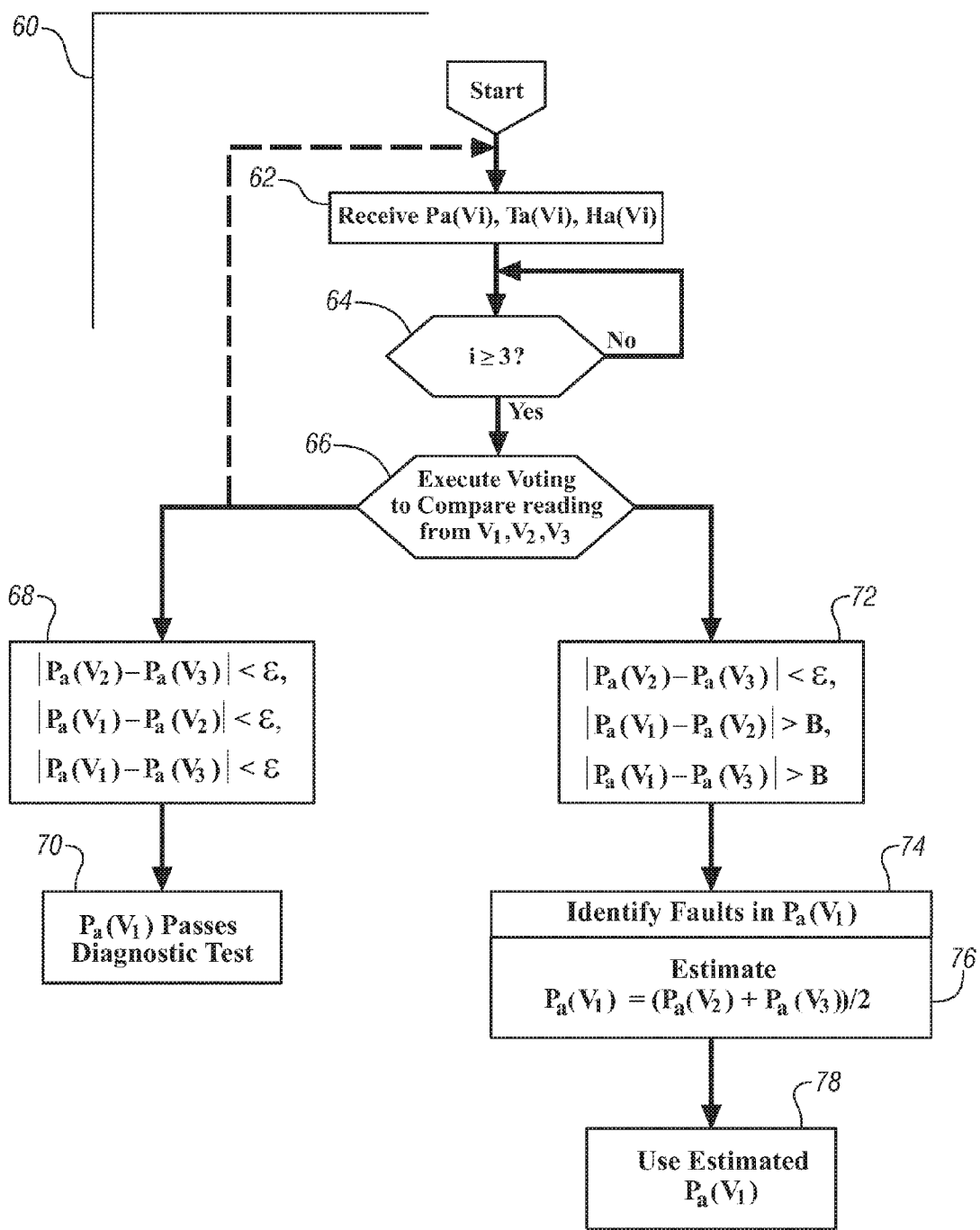

Referring now to FIG. 3, a logic flowchart 60 illustrative of monitoring the sensing system for the host vehicle equipped with inter-vehicle communications capability is now described. The vehicle receives signal readings comprising analogous inputs from other vehicles that are close in proximity, i.e., within range of the short-range communications system (Step 62). The analogous inputs the vehicle receives comprise average values of ambient conditions from at least two other vehicles within the same ambient environment and within a limited period of time (Step 64). The ambient conditions in this illustration comprise air pressure $P_a$, air temperature $T_a$, and humidity, $H_a$. Analogous inputs can comprise ambient temperature, pressure, and humidity signal readings obtained from each of the vehicles, and are independent of the type of sensing system or how the readings were obtained in each of the vehicles.

When readings from the host vehicle and at least two other vehicles are obtained, the readings from each of the vehicles are selectively compared, in this embodiment by executing voting as described hereinbelow (Step 66).

The voting diagnostic algorithm is executed as described with reference to Eq. 2, to compare differences between measured ambient pressures, $P_a$, for the three vehicles, i.e., $V_1$, $V_2$, $V_3$:

$$|P_a(V_2)-P_a(V_3)|<\epsilon, \ |P_a(V_1)-P_a(V_2)|<\epsilon, \ |P_a(V_1)-P_a(V_3)|<\epsilon; \quad [2]$$

wherein $\epsilon$ represents allowable pressure error between vehicles, and is a small positive value determined based upon allowable measurement error for pressure sensors. When this series of equations is satisfied (Step 68), it is determined that all ambient air pressure sensors work properly (Step 70).

Under the following conditions, as depicted with reference to Eq. 3:

$$|P_a(V_2)-P_a(V_3)|<\epsilon, \ |P_a(V_1)-P_a(V_2)|>B, \ |P_a(V_1)-P_a(V_3)|>B; \quad [3]$$

wherein $B>\epsilon>0$, the system can detect that the ambient air pressure sensor of vehicle $V_1$ has an in-range fault (Step 72). The control module for vehicle $V_1$ can store the fault in memory, e.g., in RAM. Multiple values of calculated average ambient pressure output from the sensor can communicated within the vehicle-to-vehicle network during the same trip. When the diagnostic routine continues to indicate an in-range fault with the sensor of vehicle $V_1$, the fault can be confirmed and a flag set in the engine control module indicating a confirmed in-range fault for the trip (Step 74). The ambient pressure sensor reading in vehicle $V_1$, can be corrected by estimating ambient pressure from the pressure information communicated from the other vehicles (Step 76), as shown with reference to Eq. 4:

$$P_a(V_1) = \frac{P_a(V_2) + P_a(V_3)}{2}. \quad [4]$$

This estimated value for $P_a$ can be used by the host vehicle $V_1$ for control and operation (Step 78). Since ambient conditions change slowly, fault tolerant accommodation is typically more reliable than using a default value.

Similarly, the same diagnostic routine can be applied to ambient air temperature sensors, as depicted with reference to Eq. 5:

$$|T_a(V_2)-T_a(V_3)|<\epsilon, |T_a(V_1)-T_a(V_2)|<\epsilon, |T_a(V_1)-T_a(V_3)|<\epsilon; \quad [5]$$

wherein $\epsilon$ in this instance represents allowable temperature error between vehicles, and is a small positive value determined based upon allowable measurement error for temperature sensors. When this series of equations is satisfied, it is determined that all ambient temperature sensors work properly.

Under the following conditions, as depicted with reference to Eq. 6:

$$|T_a(V_2)-T_a(V_3)|<\epsilon, |T_a(V_1)-T_a(V_2)|>B, |T_a(V_1)-T_a(V_3)|>B; \quad [6]$$

wherein $B>\epsilon>0$, the system can detect that the ambient air temperature sensor of vehicle $V_1$ has an in-range fault. The control module for vehicle $V_1$ can store the fault in memory, e.g., in RAM. Multiple values of calculated average ambient temperature output from the sensor can communicated within the vehicle-to-vehicle network during the same trip. When the diagnostic routine continues to indicate an in-range fault with the ambient air temperature sensor of vehicle $V_1$, the fault can be confirmed and a flag set in the engine control module indicating a confirmed in-range fault for the trip. The ambient temperature can be corrected by estimating ambient temperature from the temperature information communicated from the other vehicles.

Similarly, the same diagnostic routine can be applied to ambient air humidity sensors, as depicted with reference to Eq. 7:

$$|H_a(V_2)-H_a(V_3)|<\epsilon, |H_a(V_1)-H_a(V_2)|<\epsilon, |H_a(V_1)-H_a(V_3)|<\epsilon; \quad [7]$$

wherein $\epsilon$ in this instance represents allowable humidity error between vehicles, and is a small positive value determined based upon allowable measurement error for humidity sensors. When this series of equations is satisfied, it is determined that all ambient humidity sensors work properly.

Under the following conditions, as depicted with reference to Eq. 8:

$$|H_a(V_2)-H_a(V_3)|<\epsilon, |H_a(V_1)-H_a(V_2)|>B, |H_a(V_1)-H_a(V_3)|>B; \quad [8]$$

wherein $B>\epsilon>0$, the system can detect that the ambient humidity of vehicle $V_1$ has an in-range fault, and act accordingly, and as previously described with reference to the pressure and temperature sensing devices.

Figure 4:
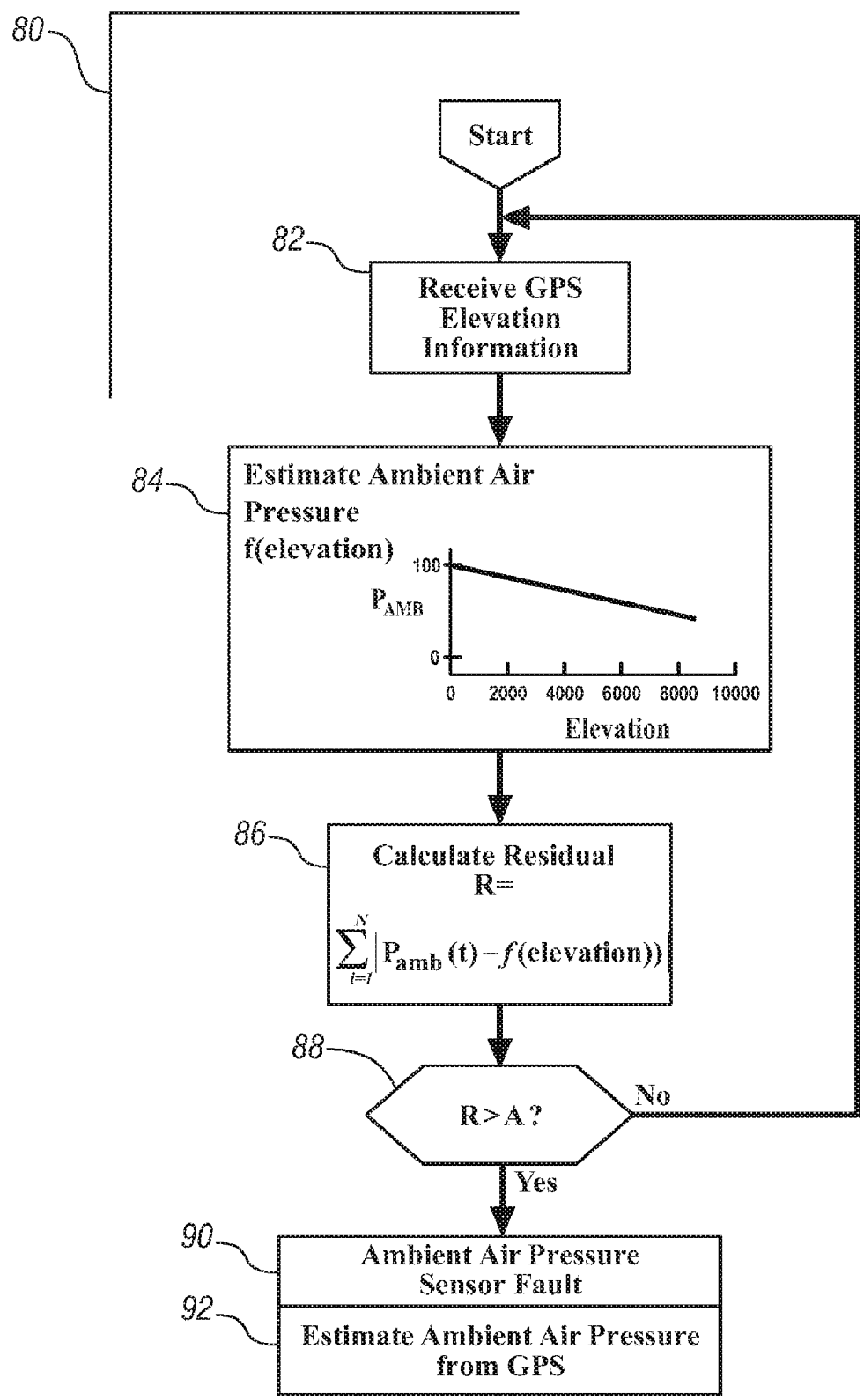

Referring now to FIG. 4, a logic flowchart 80 illustrative of monitoring the sensing system for the host vehicle equipped with an extra-vehicle communications capability is now described. The extra-vehicle communications system comprises a global position sensing (GPS) system. When the vehicle is equipped with GPS, it is able to receive and discern vehicle longitudinal and lateral positions and vehicle elevation information (Step 82). The vehicle can perform a self diagnostic test for the ambient air pressure sensor based on elevation information. Ambient air pressure ($P_{amb}$) is determined as a function of elevation (Step 84), with the temperature effect to ambient air pressure being negligible.

Next, a residual, R, can be calculated at a given time, t, (Step 86) and as depicted in Eq. 9:

$$R = \sum_{i=1}^{N} |P_{amb}(t) - P_{amb\_est}(t)| \quad [9]$$

$$= \sum_{i=1}^{N} |P_{amb}(t) - f(\text{elevation}(t))|$$

$$= \sum_{i=1}^{N} |P_{amb}(t) - a - b*(\text{elevation}(t))|;$$

wherein a and b are calibrated values, and $P_{amb\_est}$ comprises an estimated value for ambient pressure which is derived from information gained through the GPS system as a function of elevation, f(elevation). When the residual, R, exceeds a predetermined threshold (Step 88), a fault with the ambient air pressure sensor can be detected (Step 90). The ambient air pressure can be estimated from the elevation data supplied by the GPS system as a backup system (Step 92). It may be feasible to eliminate the ambient air pressure sensor from the vehicle for GPS-equipped systems, if the pressure sensor is not used for other sensing, e.g., for manifold pressure sensing.

The ambient sensing devices described herein are meant to be illustrative, with the invention encompassing various on-vehicle sensing devices, methods, and systems. It is further understood that a plurality of types of sensing devices and systems can be used to sense ambient conditions.

Scaling of the sensed conditions is preferably uniform, e.g., degrees Celsius. Alternatively the systems can be made to accommodate scaling conversions (e.g., from °F. to °C.) when the communicated information so informs the control modules.

The invention described hereinabove uses a vehicle network to create a virtual redundant hardware system using information from surrounding vehicles equipped with inter-vehicle communication capabilities. The virtual redundancy permits monitoring and evaluation of operation to detect in-range faults in ambient sensors, e.g., ambient air pressure sensors, ambient temperature sensors, and humidity sensors, preferably using a voting technique. The inter-vehicle communications system compares outputs of such sensors with outputs from sensors on vehicles in proximity to the vehicle. A sensor fault can be compensated for through the implementation of fault tolerant strategies and methodologies, allowing continued operation and limp-home capacity. Furthermore, a method is provided to estimate ambient air pressure based on elevation information originating from a three-dimensional map on a system equipped with a global position sensing ('GPS') system.

The invention has been described with specific reference to the embodiments and modifications thereto. Further modifications and alterations may occur to others upon reading and understanding the specification. It is intended to include all such modifications and alterations insofar as they come within the scope of the invention.

The invention claimed is:

1. Method for monitoring a sensing system for a host vehicle equipped with wireless inter-vehicle communications capability, comprising:
   said host vehicle determining a respective measure of an ambient environmental condition utilizing a sensor equipped on said host vehicle;
   receiving wireless transmissions from other vehicles within communication range comprising corresponding respective measures of said ambient environmental condition;
   diagnosing integrity of the host vehicle respective measure of the ambient environmental condition based on the host vehicle respective measure of the ambient environmental condition and the other vehicles respective measures of said ambient environmental condition;
   detecting an in-range fault of the sensor based upon the host vehicle respective measure of the ambient environmental condition and the other vehicles respective measures of said ambient environmental condition; and
   estimating a correct ambient environmental condition for the host vehicle associated with only the other vehicles respective measures of said ambient environmental condition when an in-range fault is detected.

2. The method of claim 1, wherein said ambient environmental condition comprises one of humidity, pressure and temperature.

3. The method of claim 1, wherein diagnosing integrity of the host vehicle respective measure of the ambient environmental condition comprises selectively comparing the respective measures of the ambient environmental condition from the host vehicle and the other vehicles.

4. The method of claim 3, further comprising identifying a fault in the host vehicle respective measure of the ambient environmental condition based upon the selectively compared respective measures of ambient environmental conditions.

5. The method of claim 4, further comprising controlling operation of the host vehicle based upon the estimated correct ambient environmental condition for the host vehicle 6. The method of claim 3, further comprising determining the sensing system of the host vehicle is functioning as intended when differences between the selectively compared respective measures of the ambient environmental conditions from the host vehicle and the other vehicles are each less than a threshold.

7. The method of claim 3, wherein selectively comparing the respective measures of the ambient environmental condition from the host vehicle and the other vehicles comprises executing a voting scheme to compare the respective measures of the ambient environmental condition from the host vehicle and the other vehicles.

* * * * *